United States Patent
Yu et al.

(10) Patent No.: US 8,004,845 B2
(45) Date of Patent: Aug. 23, 2011

(54) FASTENING ASSEMBLY FOR HEAT DISSIPATION DEVICE

(75) Inventors: Jian-Ping Yu, Shenzhen (CN); Cui-Jun Lu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 561 days.

(21) Appl. No.: 12/241,052

(22) Filed: Sep. 30, 2008

(65) Prior Publication Data

US 2009/0269952 A1    Oct. 29, 2009

(30) Foreign Application Priority Data

Apr. 28, 2008   (CN) .......................... 2008 1 0066870

(51) Int. Cl.
*H05K 7/20*       (2006.01)

(52) U.S. Cl. ....... 361/719; 361/704; 361/807; 165/80.3; 257/718; 257/719; 24/453

(58) Field of Classification Search .................. None
See application file for complete search history.

(56) References Cited

U.S. PATENT DOCUMENTS

| | | | |
|---|---|---|---|
| 6,307,748 B1 * | 10/2001 | Lin et al. ........................ | 361/704 |
| 6,697,256 B1 * | 2/2004 | Horng et al. ................... | 361/704 |
| 7,262,969 B2 * | 8/2007 | Lee et al. ....................... | 361/704 |
| 7,342,796 B2 * | 3/2008 | Aukzemas ..................... | 361/719 |
| 7,344,345 B2 * | 3/2008 | Aukzemas ..................... | 411/372 |
| 7,359,200 B2 * | 4/2008 | Zhou et al. ..................... | 361/704 |
| 7,474,530 B2 * | 1/2009 | Stewart et al. ................. | 361/704 |
| 7,576,989 B2 * | 8/2009 | Li et al. .......................... | 361/719 |
| 2007/0217159 A1 * | 9/2007 | Long et al. ..................... | 361/704 |

* cited by examiner

*Primary Examiner* — Boris Chervinsky
(74) *Attorney, Agent, or Firm* — Frank R. Niranjan

(57) ABSTRACT

A fastening assembly used for securing a heat dissipation device to a printed circuit board, comprises a sleeve, an inserting device extending through the sleeve, a spring encircling the inserting device and received in the sleeve, and a supporting device inserted in the sleeve. The inserting device engages with a back plate below the printed circuit board. The sleeve is integrally formed of plastic and comprises a hollow body, a resilient portion extending from an outer surface of the body and pressing a bottom of the heat dissipation device upwardly, and four supporting portions extending from the outer surface of the body and pressing a top of the heat dissipation device downwardly. The supporting device is inserted between the body and the resilient portion, and abuts against the resilient portion, to thereby reliably keep the resilient portion at its locked position.

18 Claims, 4 Drawing Sheets

FASTENING ASSEMBLY FOR HEAT DISSIPATION DEVICE

BACKGROUND OF THE INVENTION

1. Field of the Invention

The present invention relates generally to a fastening assembly, and more particularly to a fastening assembly used for reliably fastening a heat dissipation device to a printed circuit board.

2. Description of Related Art

With development in computer technology, electronic devices operate at high speed. It is well known that higher speed the electronic devices operate at, more heat they generate. If the heat is not dissipated duly, the stability of the operation of the electronic devices will be impacted severely. Generally, in order to ensure the electronic device to run normally, a heat dissipation device is used to dissipate the heat generated by the electronic device. Moreover, in order to keep the heat dissipation device intimately contacting the electronic device, a fastening assembly is usually desired to secure the heat dissipation device to the electronic device.

Nowadays, numerous fastening assemblies are used to secure the heat dissipation devices to the electronic devices located on respective printed circuit boards. Typically, a fastening assembly mainly formed of plastic is used. The fastening assembly comprises a lengthwise shaft, a head formed at an end of the shaft, a spring encircling the shaft and a retaining portion formed at an opposite end of the shaft for engaging with the printed circuit board. The retaining portion comprises a left flexible portion, a right flexible portion and a longitudinal groove defined between the two portions for providing a deforming space to the two portions. In assembly, the retaining portion of the fastening assembly is inserted into a through hole defined in the heat dissipation device and an aperture defined in the printed circuit board. Due to confine of the hole and the aperture, the left flexible portion and the right flexible portion are deformed toward each other in the groove, and then pass through the hole and the aperture. Thereafter, the left flexible portion and the right flexible portion are released to their original positions where they are free. Here, the heat dissipation device and the printed circuit board are sandwiched between the retaining portion and the spring with the retaining portion pressing against the printed circuit board upwardly and the spring pressing the heat dissipation device downwardly toward the printed circuit board. Thus, the heat dissipation device is secured to the electronic device. However, due to the fastening assembly being formed of plastic, the fastening assembly is prone to aging after being used for a long time. Then the retaining portion of the fastening assembly will become loosen due to aging and thus cannot secure the fastening assembly on the heat dissipation device firmly, causing an unreliable engagement between the heat dissipation device and the electronic device.

What is needed, therefore, is a fastening assembly which can overcome the above disadvantages.

SUMMARY OF THE INVENTION

A fastening assembly used for securing a heat dissipation device to a printed circuit board, comprises a sleeve, an inserting device extending through the sleeve, a spring encircling the inserting device and received in the sleeve, and a supporting device engaged in the sleeve. The inserting device engages with a back plate below the printed circuit board to secure the heat dissipation device on the printed circuit board. The sleeve is integrally formed of plastic and comprises a hollow body, a resilient portion extending from an outer circumference of the body and pressing the heat dissipation device upwardly, and four supporting portions extending from the outer circumference of the body and pressing the heat dissipation device downwardly. The supporting device is inserted between the body and the resilient portion and abuts against the resilient portion, whereby a deformation of the resilient portion due to aging is prevented. Thus the heat dissipation device can be securely mounted on the printed circuit board.

Other advantages and novel features will become more apparent from the following detailed description of preferred embodiments when taken in conjunction with the accompanying drawings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
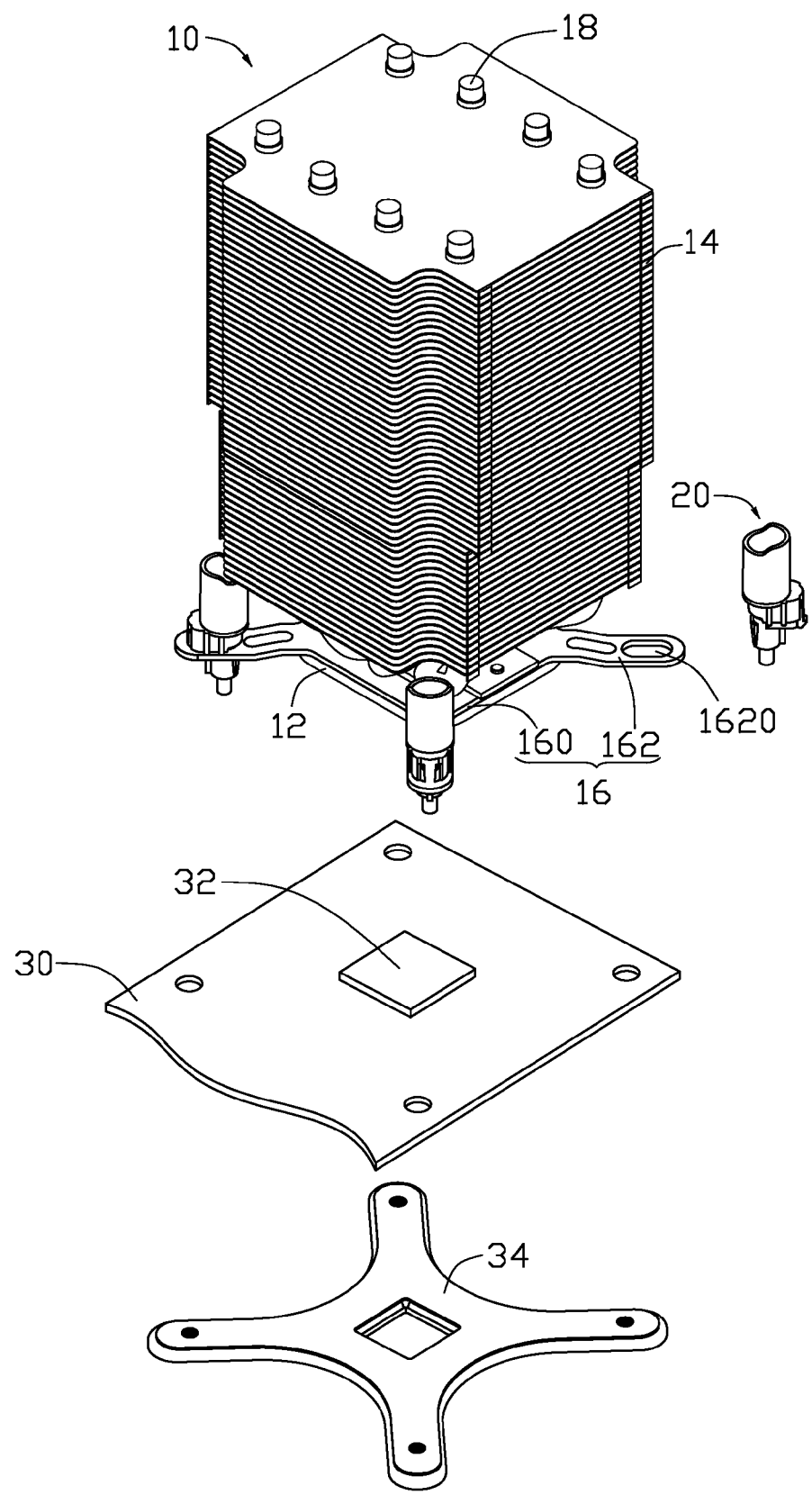
FIG. 1 is an assembled view of a fastening assembly in accordance with a preferred embodiment of the present invention together with a heat dissipation device and an electronic device mounted on a printed circuit board.

Referring to FIG. 1, a fastening assembly 20 in accordance with an embodiment of the present invention is used for securing a heat dissipation device 10 to an electronic device 32 mounted on a printed circuit board 30. The heat dissipation device 10 comprises a square heat absorbing plate 12 thermally contacting with the electronic device 32, a heat sink 14 located above and spaced from the heat absorbing plate 12, a bracket 16 fixed on the heat absorbing plate 12 and four U-shaped heat pipes 18 extending through the heat sink 14 and attached to the heat absorbing plate 12.

The bracket 16 comprises a rectangular body 160 attached to a top of the heat absorbing plate 12 and four arms 162 extending outwardly from four corners of the rectangular body 160. The four arms 162 each define an elliptical through hole 1620 near an outer end thereof.

Figure 2:
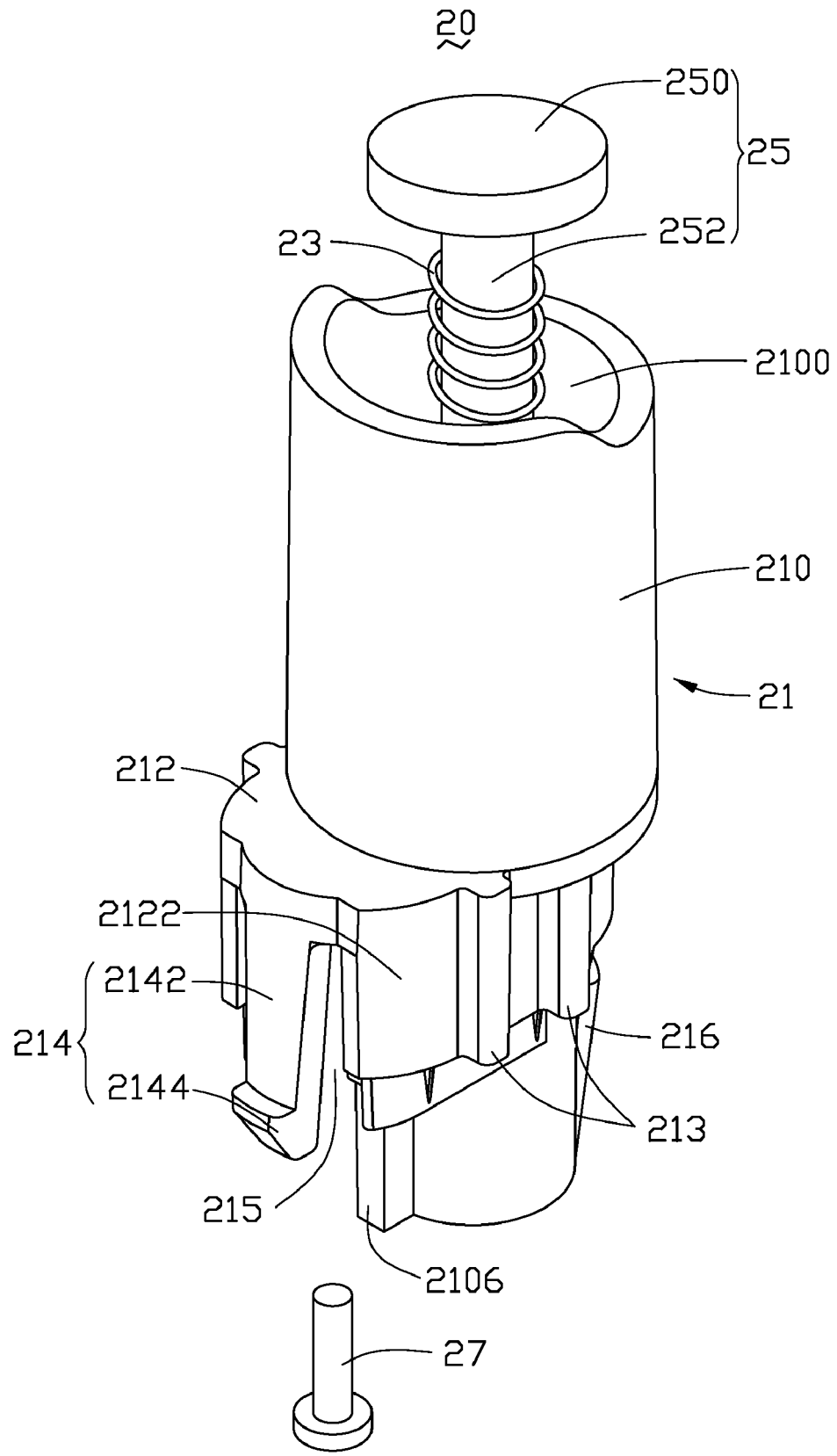
FIG. 2 is an enlarged view of the fastening assembly of FIG. 1, wherein the fastening assembly is in a released position.
Figure 3:
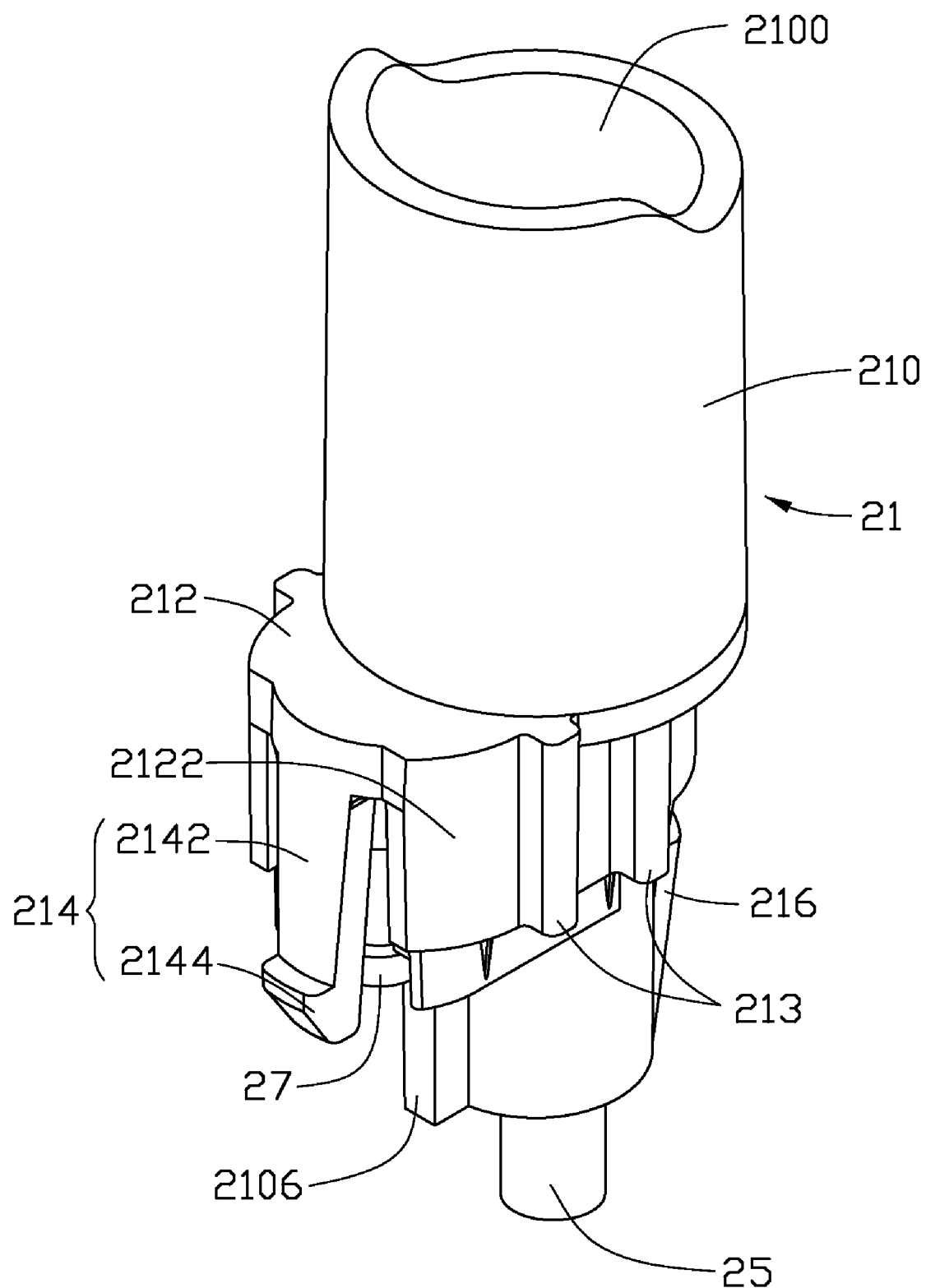
FIG. 3 is a view similar to FIG. 2, wherein the fastening assembly is in a locked position.
Figure 4:
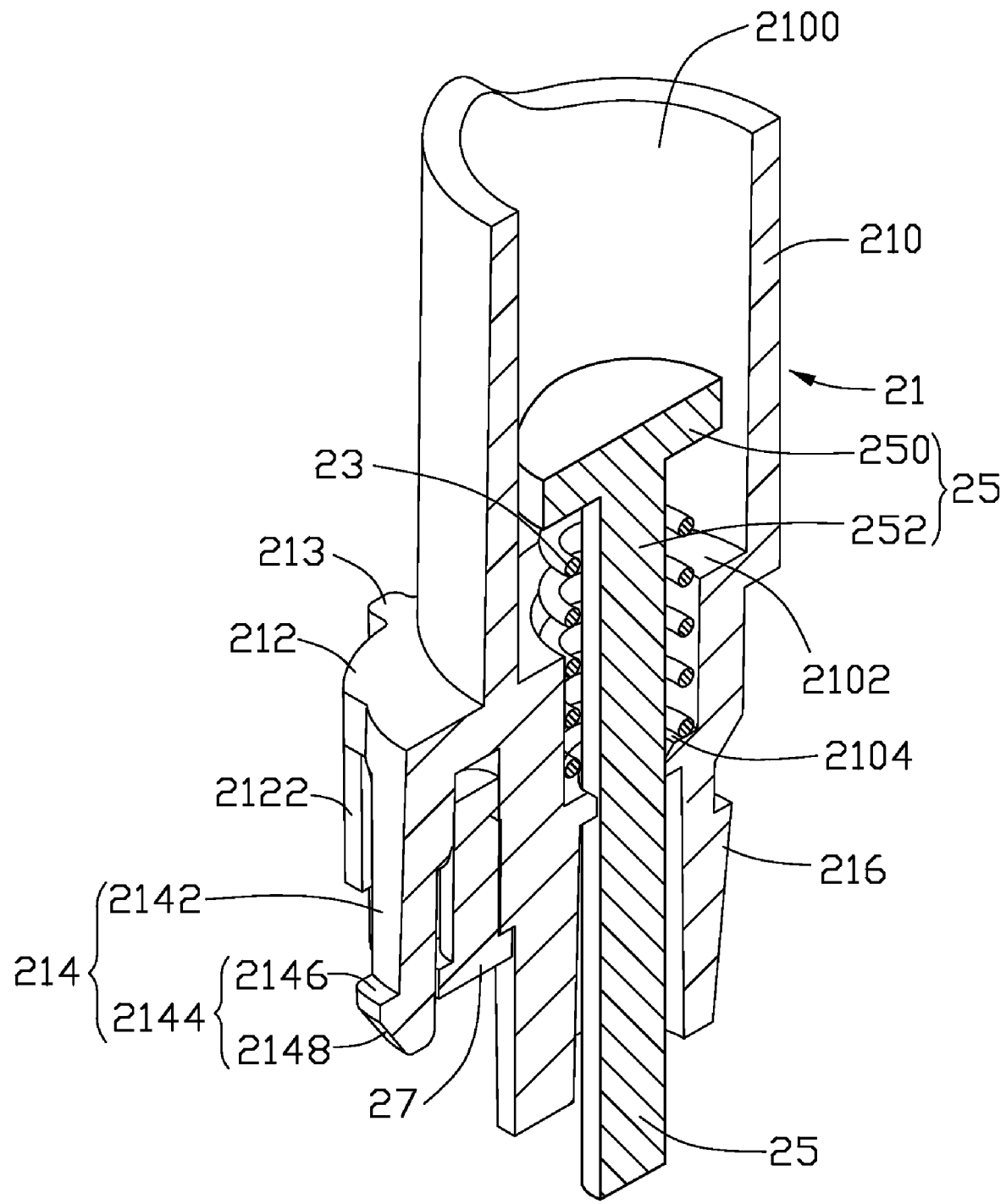
FIG. 4 is a cross-section view of FIG. 3.

Also referring to FIGS. 2, 3 and 4, the fastening assembly 20 comprises a sleeve 21, a first screw 25 extending through the sleeve 21 and acting as an inserting device, a spring 23 encircling the first screw 25 and received in the sleeve 21, and a second screw 27 engaged in the sleeve 21 and acting as a supporting device. The first screw 25 comprises a circular head 250 and a cylindrical shaft 252 extending downwardly from the head 250. The first screw 25 with the spring 23 encircling thereon is for threadedly engaging with a back plate 34 located below the printed circuit board 30 (see FIG. 1). The second screw 27 engaged in the sleeve 21 is used for preventing the sleeve 21 from deforming.

The sleeve 21 is integrally formed of plastic and comprises a hollow body 210 defining a through hole 2100 therein, for receiving the first screw 25 and the spring 23. The body 210 has a column-shaped circumferential outer surface with a wider, upper part and a narrower, lower part. The through hole 2100 shrinks inwardly from a top to a bottom thereof, whereby the through hole 2100 has three different inner diameters, wherein the inner diameter of the through hole 2100 in the top of the body 210 is the largest, and the inner diameter of the through hole 2100 in the bottom of the body 210 is the smallest. Two annular inner steps 2102, 2104 (shown in FIG. 4) are formed at joints of three parts of the through hole 2100 with the three different inner diameters, wherein the inner step 2102 is located above the inner step 2104 and has an inner diameter smaller than an outer diameter of the head 250 of the first screw 25, for supporting the head 250 thereon, and the inner step 2104 has an inner diameter smaller than an outer diameter of the spring 23, for supporting a bottom of the spring 23 thereon, whereby the first screw 25 and the spring 23 are prevented from falling off from the bottom of the sleeve 21. An outer step 212 extends outwardly and horizontally from the circumferential outer surface of the body 210 at a position corresponding to the inner step 2102. Two lateral walls 2122 extend downwardly from a bottom surface of the outer step 212 at two opposing sides thereof. The two lateral walls 2122 are spaced from each other. Two pairs of supporting portions 213 are formed on a periphery of the sleeve 21, and are located at two flanks of the two lateral walls 2122 for pressing a top surface of the arm 162 of the bracket 16, thereby pressing the heat dissipation device 10 toward the printed circuit board 30. A resilient portion 214 extends downwardly and slantwise from a middle portion of a periphery of the outer step 212 and is located between the two lateral walls 2122, for being engagingly received in the elliptical through hole 1620, after the sleeve 21 extends through the arm 162 of the heat dissipation device 10. A bulge 2106 projects outwardly from the circumferential outer surface of the sleeve 21 and is located at a lower portion thereof. The resilient portion 214 is angled an acute angle with respect to the bulge 2106. A gap 215 is formed between an inner surface of the resilient portion 214 and an outer surface of the bulge 2106, for receiving the second screw 27 therein. A wedge-shaped rib 216 extends outwardly from the circumferential outer surface of the lower portion of the body 210, opposite to the bulge 2106. The rib 216 has a gradually increased thickness along a bottom-to-top direction thereof. The rib 216 is for guiding the sleeve 21 through the elliptical through hole 1620 of the arm 162 when assembling the sleeve 21 with the heat dissipation device 10, and preventing the sleeve 21 from falling off the arm 162 after the sleeve 21 is substantially locked with the arm 162. The resilient portion 214 includes a beam 2142 and a retaining block 2144 formed at a distal, bottom end of the beam 2142. The beam 2142 can be flexibly deformed toward the bulge 2106, guiding the sleeve 21 into the elliptical through hole 1620 of the arm 162 of the bracket 16 before the second screw 27 engages in the gap 215 and be deformed outwardly by pushing of the second screw 27 after the second screw 27 engages in the gap 215. The retaining block 2144 includes a flat, horizontal abutting face 2146 and a slantwise guiding face 2148 slanting inwardly along a top-to-bottom direction (shown in FIG. 4). The slantwise guiding face 2148 can be pressed by an inner sidewall of the arm 162 of the bracket 16 defining the through hole 1620, to push the beam 2142 to be deformed inwardly, and thereby to guide the sleeve 21 into the corresponding through hole 1620 of the arm 162. The flat abutting face 2146 is located below bottom surfaces of the supporting portions 213, for pressing a bottom surface of the arm 162 after the retaining block 2144 extends through the through hole 1620 of the arm 162, whereby the arm 162 is sandwiched between the bottom surfaces of the supporting portions 213 and the flat abutting face 2146 of the retaining block 2144 when the fastening assembly 20 is mounted to the arm 162.

In assembly, each fastening assembly 20 is brought to extend through the corresponding through hole 1620 in the bracket 16 of the heat dissipation device 10. Due to confine of the through hole 1620 of the arm 162, the beam 2142 is deformed inwardly to make the retaining block 2144 pass through the through hole 1620 of the arm 162. After the sleeve 21 being substantially inserted into the arm 162, the beam 2142 is released outwardly to its original position. Then the second screw 27 is inserted into the gap 215 formed between the inner surface of the resilient portion 214 and the outer surface of the bulge 2106, abutting against the inner surface of the resilient portion 214, thereby to hold the resilient portion 214 securing with the arm 162 reliably. At this position, the bracket 16 of the heat dissipation device 10 is sandwiched between bottoms of the supporting portions 213, the flat abutting face 2146 of the retaining block 2144 of the resilient portion 214 and a top of the rib 216, with the abutting face 2146 of the retaining block 2144 and a top surface of the rib 216 abutting against the bottom surface of the arm 162 upwardly and the supporting portions 213 pressing the top surface of arm 162 downwardly towards the printed circuit board 30. Finally, the first screw 25 with the spring 23 encircling thereon is brought to extend through the through hole 2100 of the sleeve 21 and engage with the back plate 34 below the printed circuit board 30, thereby securing the heat dissipation device 10 on the printed circuit board 30.

In order to prevent the resilient portion 214 from deforming inwardly due to aging after the fastening assembly 20 has been used for a long time, the second screw 27 is provided to be inserted into the gap 215 of the sleeve 21, keeping the resilient portion 214 at its original position. Therefore, the fastening assembly 20 can still reliably secure the heat dissipation device 10 on the printed circuit board 30 even after a long-period use.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A fastening assembly used for securing a heat dissipation device to a printed circuit board, comprising:
    a sleeve mounted on the heat dissipation device and comprising a resilient portion for abutting against the heat dissipation device upwardly;
    an inserting device extending downwardly through the sleeve for engaging with a back plate below the printed circuit board; and
    a supporting device inserted upwardly into the sleeve and abutting against the resilient portion.

2. The fastening assembly as claimed in claim 1, wherein the fastening assembly further includes a spring encircling the inserting device, the sleeve comprising a hollow body receiving the inserting device and the spring therein.

3. The fastening assembly as claimed in claim 2, wherein the inserting device includes a head and a shaft extending downwardly from the head.

4. The fastening assembly as claimed in claim 3, wherein the body forms a first annular inner step and a second annular inner step therein, the first inner step having an inner diameter larger than that of the second inner step, the first inner step supporting the head of the inserting device and the second inner step supporting the spring.

5. The fastening assembly as claimed in claim 4, wherein the resilient portion is formed at an outer surface of the body, the supporting device being received between the resilient portion and the body.

6. The fastening assembly as claimed in claim 2, wherein the sleeve further includes an outer step and two spaced lateral walls extending downwardly from the outer step, the outer step connecting the resilient portion and the body, two pairs of supporting portions being formed on a periphery of the sleeve, and being located at two flanks of the two lateral walls for pressing the heat dissipation device downwardly.

7. The fastening assembly as claimed in claim 6, wherein the resilient portion includes a beam located between the two lateral walls and a retaining block formed at a distal end of the beam, the retaining block is located below the two pairs of supporting portions for pressing a bottom of the heat dissipation device upwardly.

8. The fastening assembly as claimed in claim 7, wherein the sleeve further includes a rib extending outwardly from the outer surface of the body, the rib being located opposite to the resilient portion and used for pressing the heat dissipation device upwardly.

9. The fastening assembly as claimed in claim 8, wherein the rib is wedge-shaped, with a thickness gradually increased along a bottom-to-top direction of the rib.

10. An electronic assembly, comprising:
a printed circuit board with an electronic device mounted thereon;
a heat sink thermally contacting with the electronic device and including a bracket;
a back plate located below the printed circuit board; and
a plurality of fastening assemblies extending through the bracket of the heat dissipation device and the printed circuit board to engage with the back plate to mount the heat dissipation device on the electronic device, each of the fastening assemblies comprising:
a sleeve extending through the bracket of the heat dissipation device, the sleeve comprising a body, a resilient portion being offset from the body and spaced a gap from the body, and at least one supporting portion extending from the body, the at least one supporting portion and the resilient portion sandwiching the bracket of the heat dissipation device therebetween;
an inserting device extending downwardly though the sleeve to engage with the back plate; and
a supporting device inserted into the gap between the body and the resilient portion of the sleeve and abutting against the resilient portion.

11. The electronic assembly as claimed in claim 10, wherein the heat sink comprises a heat absorbing plate contacting with the electronic device, the bracket mounted on the heat absorbing plate, a plurality of fins located above and spaced from the bracket, a plurality of heat pipes extending through the fins and attached to the heat absorbing plate.

12. The electronic assembly as claimed in claim 10, wherein the sleeve further includes an outer step, the outer step connecting the resilient portion and the body, the resilient portion extending downwardly from the outer step.

13. The electronic assembly as claimed in claim 12, wherein the sleeve further includes two opposing lateral walls extending downwardly from the outer step, two supporting portions being located at two flanks of the two lateral walls for pressing the bracket of the heat dissipation device downwardly.

14. The electronic assembly as claimed in claim 13, wherein the resilient portion is spacedly located between the two lateral walls.

15. The electronic assembly as claimed in claim 13, wherein the resilient portion includes a beam connecting the outer step and a retaining block formed at a distal end of the beam, the retaining block being located lower than the two supporting portions and the abutting upwardly against the bracket of the heat dissipation device.

16. The electronic assembly as claimed in claim 10, wherein the sleeve has a bulge projecting outwardly from the body thereof and facing the resilient portion, the gap being defined between the resilient portion and the bulge.

17. The electronic assembly as claimed in claim 10, wherein a spring is sleeved on the inserting device to press the sleeve downwardly.

18. The electronic assembly as claimed in claim 10, wherein the bracket further comprises a body attached to a top of the heat absorbing plate and four arms extending outwardly from four corners of the rectangular body, the four arms each defining a through hole for receiving a corresponding fastening assembly.

* * * * *